(12) United States Patent
Eden et al.

(10) Patent No.: US 8,816,435 B2
(45) Date of Patent: Aug. 26, 2014

(54) FLEXIBLE HYBRID PLASMA-SEMICONDUCTOR TRANSISTORS AND ARRAYS

(75) Inventors: J. Gary Eden, Champaign, IL (US); Paul A. Tchertchian, Mission Viejo, CA (US); Thomas J. Houlahan, Urbana, IL (US); Dane J. Sievers, Fisher, IL (US); Benben Li, Urbana, IL (US); Clark J. Wagner, Rowland Heights, CA (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 28 days.

(21) Appl. No.: 13/186,401

(22) Filed: Jul. 19, 2011

(65) Prior Publication Data

US 2012/0104554 A1   May 3, 2012

Related U.S. Application Data

(60) Provisional application No. 61/365,429, filed on Jul. 19, 2010.

(51) Int. Cl.
*H01L 27/12* (2006.01)

(52) U.S. Cl.
USPC .......................................... 257/347; 257/565

(58) Field of Classification Search
USPC ................................. 257/347, 565
See application file for complete search history.

(56) References Cited

U.S. PATENT DOCUMENTS

| | | |
|---|---|---|
| 4,683,399 A | 7/1987 | Soclof |
| 5,765,073 A | 6/1998 | Schoenbach et al. |

(Continued)

FOREIGN PATENT DOCUMENTS

WO   WO 2007/087371   8/2007

OTHER PUBLICATIONS

Chen. K.-F., et.al., "The plasma transistor: A microcavity plasma device coupled with a low voltage, controllable electron emitter", *Applied Physics Letters*, 93: 161501, 2008.

(Continued)

*Primary Examiner* — Mark Prenty
(74) *Attorney, Agent, or Firm* — Greer, Burns & Crain, Ltd.

(57) ABSTRACT

Preferred embodiment flexible and on wafer hybrid plasma semiconductor devices have at least one active solid state semiconductor region; and a plasma generated in proximity to the active solid state semiconductor region(s). Doped solid state semiconductor regions are in a thin flexible solid state substrate, and a flexible non conducting material defining a microcavity adjacent the semiconductor regions. The flexible non conducting material is bonded to the thin flexible solid state substrate, and at least one electrode is arranged with respect to said flexible substrate to generate a plasma in said microcavity, where the plasma will influence or perform a semiconducting function in cooperation with said solid state semiconductor regions. A preferred on-wafer device is formed on a single side of a silicon on insulator wafer and defines the collector (plasma cavity), emitter and base regions on a common side, which provides a simplified and easy to manufacture structure. A preferred embodiment array of flexible hybrid plasma transistors of the invention is an n+pn PBJT fabricated between two flexible sheets. One or both of the flexible sheets is transparent. The overall array structure is planar, and the planarized structure is sealed between the two flexible sheets. Visible or ultraviolet light is emitted during operation by plasma collectors in the array. In preferred embodiments, individual PBJTs in the array serve as sub-pixels of a full-color display.

11 Claims, 21 Drawing Sheets

(56) References Cited

U.S. PATENT DOCUMENTS

| | | | |
|---|---|---|---|
| 6,016,027 | A | 1/2000 | DeTemple et al. |
| 6,139,384 | A | 10/2000 | DeTemple et al. |
| 6,194,833 | B1 | 2/2001 | DeTemple et al. |
| 6,815,891 | B2 | 11/2004 | Eden et al. |
| 6,970,219 | B1 | 11/2005 | Hermann |
| 7,112,918 | B2 | 9/2006 | Eden et al. |
| 2005/0253290 | A1 | 11/2005 | Yokoyama et al. |
| 2006/0082319 | A1 | 4/2006 | Eden et al. |
| 2010/0289413 | A1 | 11/2010 | Eden et al. |
| 2011/0037102 | A1 | 2/2011 | Tchertchian et al. |
| 2012/0104554 | A1* | 5/2012 | Eden et al. ............... 257/586 |

OTHER PUBLICATIONS

Eden, J. Gary, et. al., "Microplasma Channels and Large Arrays: Applications to Photomedicine, Microlasers, and Reactors on a Chip", *Final Report on AFOSR Grant No. FA9550-07-1-0003*, Sep. 29, 2006-Sep. 30, 2009, Oct. 2009.

Park, S.-J., et. al., "Flexible microdischarge arrays: Metal/polymer devices", *Applied Physics Letters*, vol. 77, No. 2, Jul. 10, 2000.

Park, S.-J., et. al., "Arrays of microdischarge devices having 50-100 μm square pyramidal Si anodes and screen cathodes", *Electronics Letters*, vol. 37, No. 3, Feb. 1, 2001.

Physorg.com, "Scientist fabricate first plasma transistor", www.physorg.com/news145705715.html, Nov. 12, 2008.

Sciencedaily, "New Plasma Transistor Could Create Sharper Displays", http://www.sciencedaily.com/releases/2009/02/090204131617.htm, Feb. 17, 2009.

Tarighat, Roohollah, S., et. al., "Realization of Flexible Plasma Display Panels on PET Substrates", *Proceeding of the IEEE*, vol. 93, No. 7, Jul. 2005.

\* cited by examiner

Top View

Cross Sectional View

Top View

Cross Sectional View

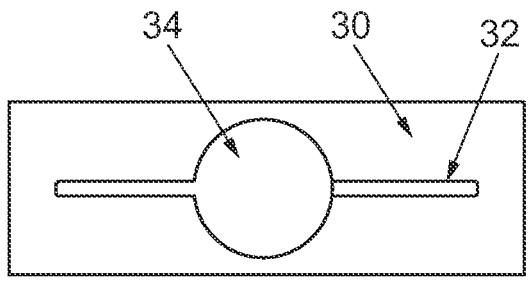
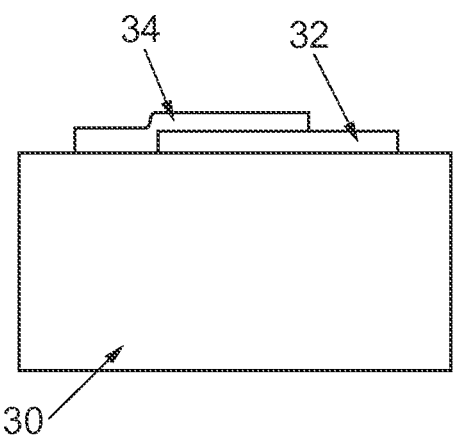
FIG. 6A
FIG. 6B

Top View

Cross Sectional View

FLEXIBLE HYBRID PLASMA-SEMICONDUCTOR TRANSISTORS AND ARRAYS

PRIORITY CLAIM AND REFERENCE TO RELATED APPLICATION

The application claims priority under 35 U.S.C. §119 from prior provisional application Ser. No. 61/365,429, which was filed Jul. 19, 2010.

STATEMENT OF GOVERNMENT INTEREST

This invention was made with government support under Grant No. FA-9550-07-1-0003 awarded by the United States Air Force Office of Scientific Research. The government has certain rights in the invention.

FIELD

Fields of the invention include microplasma and macroplasma generation. Applications of the invention include semiconductor devices, optoelectronics, photonics, microelectronics, and plasma electronics.

BACKGROUND

Modern electronics rely on solid state materials and solid state semiconductors, in particular. However, plasma-based electronic devices assumed a significant role in communications and display systems in the first half of the 20$^{th}$ century. Vacuum tubes were previously used to amplify and switch signals, but have been largely replaced by solid state devices. Vacuum tubes continue, however, to be employed in specialized applications such as in the final amplifier of high power radio transmitters.

Macroplasma devices have also been used in older communications and display systems. One example is the plasma electron tube (such as the OA, OB, OC, and OD series of rare gas-plasma voltage regulators) that was widely incorporated into audio equipment as well as the power supplies of RF transmitters and receivers. Other examples include plasma switches and the 866A and 872 mercury plasma high voltage rectifiers that found application in early RF transmitters. Another example is the Nixie tube, a neon plasma based device that was an essential component of alphanumeric displays for a number of decades in the twentieth century.

Subsequent applications of plasmas to electronics or displays have often required imposing external voltages or magnetic fields so as to influence the electromagnetic field distribution in the plasma. For example, U.S. Pat. No. 5,765,073 discloses a field controlled plasma discharge display element serving as a light source element in plasma discharge electrostatic printers. The display element includes a pair of discharge electrodes and a third electrode positioned external and proximate to the discharge electrodes for the purpose of generating a control electric field. This control electric field is able to vary the intensity of the plasma discharge and its spatial distribution by distorting the shape of the discharge electric field. In this and other similar devices, a degree of control over the properties of a plasma is exerted by an auxiliary device or structure, where "auxiliary" indicates that the added device or structure is not required for sustenance of the plasma. Soclof U.S. Pat. No. 4,683,399 summarizes typical prior devices that inject electrons into vacuum with a reverse-biased pn junction, and subsequently accelerate and collect the electrons with an anode.

Most commercially available displays are rigid and somewhat fragile. Despite these limitations, large displays such as flat panel TVs having screen sizes as large as >60" have proven to be extremely successful. It is expected and would be desirable for the next generation of displays to be required to be lightweight (e.g., <100 g/ft$^2$), manufacturable by inexpensive processes at sizes of 10 m$^2$ and above (to full "wall size") and, if possible, flexible. Existing large area LED displays are certainly bright but the cost is exorbitant (>$1 k per ft2) and such displays are certainly not flexible.

SUMMARY OF THE INVENTION

Preferred embodiments include flexible and on wafer hybrid plasma semiconductor devices that have at least one active solid state semiconductor to region; and a plasma generated in proximity to the active solid state semiconductor region(s). In preferred embodiment, doped solid state semiconductor regions are in a thin flexible solid state substrate, and a flexible non conducting material defining a microcavity adjacent the semiconductor regions. The flexible non conducting material is bonded to the thin flexible solid state substrate, and at least one electrode is arranged with respect to said flexible substrate to generate a plasma in said microcavity, where the plasma will influence or perform a semiconducting function in cooperation with said solid state semiconductor regions. A preferred on-wafer device is formed on a single side of a silicon on insulator wafer and defines the collector (plasma cavity), emitter and base regions on a common side, which provides a simplified and easy to manufacture structure.

A preferred embodiment array of flexible hybrid plasma transistors of the invention is an n+pn PBJT fabricated between two flexible sheets. One or both of the flexible sheets is transparent. The overall array structure is planar, and the planarized structure is sealed between the two flexible sheets. Visible or ultraviolet light is emitted during operation by plasma collectors in the array. In preferred embodiments, individual PBJTs in the array serve as sub-pixels of a full-color display.

BRIEF DESCRIPTION OF THE DRAWINGS

FIGS. 2A-9B illustrate a preferred process sequence for fabricating large arrays of the device of FIG. 1 in polysilicon;

DETAILED DESCRIPTION OF THE PREFERRED EMBODIMENTS

Figure 1:
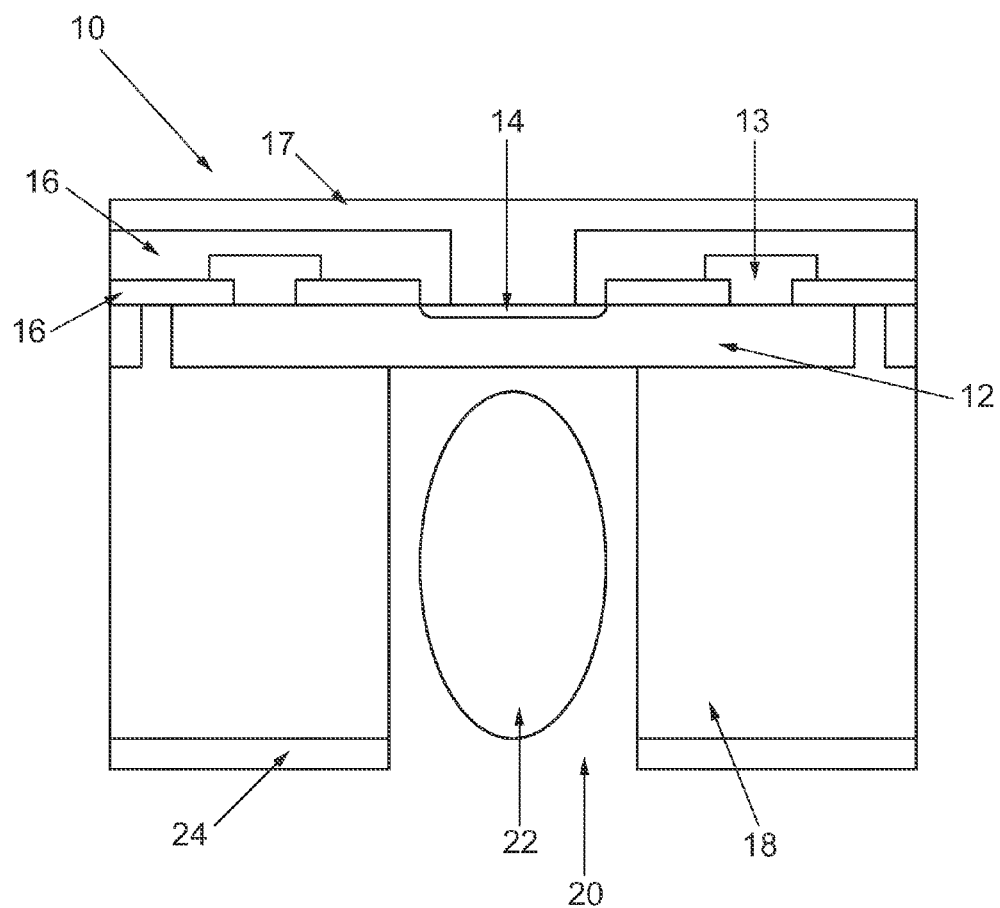
FIG. 1 is a schematic cross-section diagram that shows a preferred embodiment flexible plasma transistor of the invention.

This invention provides flexible hybrid plasma transistors and displays that can provide ultra-large area displays and can be manufactured inexpensively. The substrate in the present invention is a flexible material such as plastic, permitting a finished display able to conform to various irregular surfaces. Displays of the invention can be at least partially transparent. Flexible hybrid plasma transistor arrays of the invention are also ideal for gas processing and gas sensor applications.

In preferred embodiment arrays and displays, a plasma transistor, such as a bipolar junction transistor (PBJT), is produced using a flexible substrate. In exemplary embodiments, the emitter and base of the transistor are, together, only ~15 μm in thickness (i.e., less than one-thousandth of an inch) and very flexible. A preferred manufacture process is a lift-off-process that begins with silicon-on-insulator (SOI) wafers. Preferred fabrication processes are inexpensive and ideal for transferring the transistor emitter and base, fabricated in a semiconductor, e.g., Si, to a plastic substrate or other flexible substrate.

A preferred embodiment array of flexible hybrid plasma transistors of the invention is an n+pn PBJT fabricated between two flexible sheets. One or both of the flexible sheets is transparent. The overall array structure is planar, and the planarized structure is sealed between the two flexible sheets. Visible or ultraviolet light is emitted during operation by plasma collectors in the array. In preferred embodiments, individual PBJTs in the array serve as sub-pixels of a full-color display.

The invention provides flexible combination semiconductor and plasma devices, including transistors and phototransistors. Devices of the to invention are referred to as hybrid plasma-semiconductor devices, in which a plasma, preferably a microplasma, cooperates with conventional solid state semiconductor device regions to influence or perform a semiconducting function, such as that provided by a transistor. The plasma can perform or influence electronic or photonic semiconducting functions. The invention provides a family of hybrid plasma electronic/photonic devices having properties believed to be previously unavailable. In flexible transistor devices of the invention, a low temperature, glow discharge is integral to the hybrid transistor. Example preferred devices include hybrid BJT and MOSFET devices.

A preferred embodiment flexible hybrid plasma semiconductor device has at least one active solid state semiconductor region; and a plasma generated in proximity to the active solid state semiconductor region(s).

Preferred embodiments of the invention will now be discussed with respect to the drawings. The drawings include schematic representations that will be understood by artisans in view of the general knowledge in the art of the description that follows. Features can be exaggerated in the drawings for emphasis, and features can not be to scale. Artisans will recognize broader aspects of the invention from the description of the preferred embodiments.

FIG. 1 is a cross-sectional diagram (not drawn to scale) of a preferred embodiment flexible plasma transistor 10 of the invention of the invention. The npn device has a p-type base 12 into which an n-type emitter 14 is diffused. Electrical contact via base contact metal 13 to the base 12 is made through openings etched in a dielectric, e.g., silicon dioxide ($SiO_2$), insulating film 16. Dielectrics other than $SiO_2$, such as $Y_2O_3$ and $Si_3N_4$, are also acceptable insulating materials. Additional dielectric 16 isolates emitter contact metal 17. The base and emitter of the transistor are joined to a non-conducting flexible material 18 such as a thin plastic sheet. A cavity 20 formed in the flexible substrate is aligned with the n-type emitter 14. Plasma 22 formed within the cavity serves as the collector of the npn transistor and the cavity will generally have a characteristic transverse dimension in the range of 5 μm to several mm. The flexible substrate is nonconducting electrically but the surface on the face of the flexible substrate opposite to that from the transistor emitter and base has a thin conducting electrode film which serves as the anode 24 for the collector plasma. The device is sealed by a window material which may be, for example, thin glass or plastic. As seen in FIG. 1, the entire device can be "planarized" forming a flat plane on both sides.

Rather than sealing the window directly to the anode, a "standoff" dielectric layer can also be deposited onto the anode layer and patterned so as to allow gas to move freely from one plasma collector cavity to another within an array of the PBJT devices of FIG. 1. Operation of the device of FIG. 1 involves evacuation of the plasma collector cavity, introducing the desired gas, vapor, or mixture thereof at the proper pressure, and applying voltages of the proper magnitude to the emitter-base and collector-emitter junctions. Typically, a DC or time-varying voltage of approximately 0.1 to 10 V is applied to the base-emitter junction whereas the collector-emitter junction normally requires a voltage >100 V, and is dependent upon the dimensions of the collector plasma, the gas or vapor, and its pressure.

Although not shown in FIG. 1 the sidewalls of the plasma collector cavity, as well as the interior surface of the window, can be coated with a thin film of red, green, or blue phosphor for display applications. The thickness of the phosphor film on the cavity sidewalls will likely be different from that on the window in order to maximize the light exiting the collector cavity. Prior to depositing the phosphor, it is desirable to deposit a dielectric film or a thin stack of films, onto the cavity sidewalls in order to inhibit the diffusion of organic vapors from the flexible substrate (which may be a polymer) into the collector plasma.

Figure 2A:
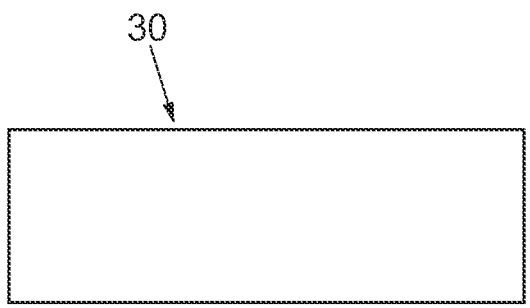
Figure 2B:
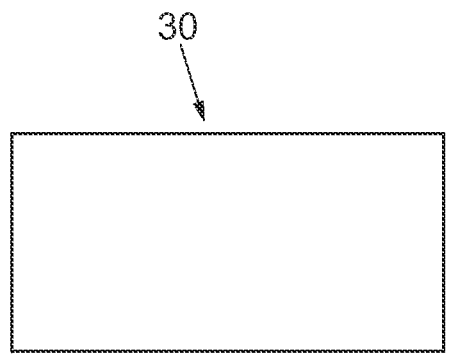
Figure 3A:
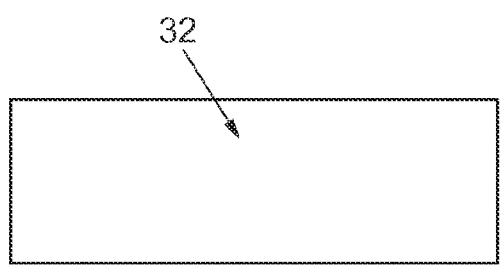
Figure 3B:
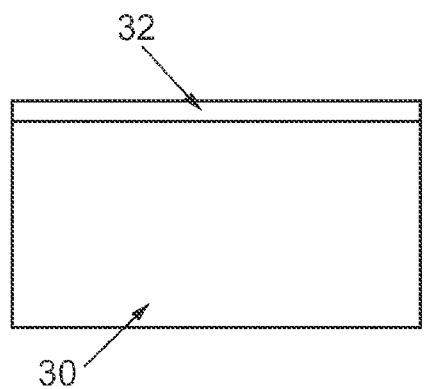
Figure 4A:
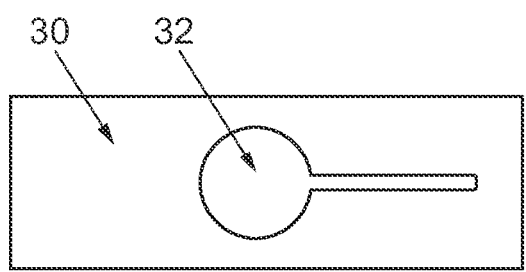
Figure 4B:
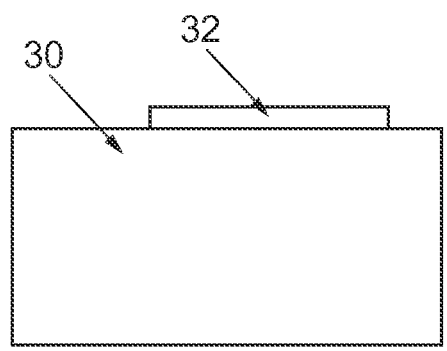
Figure 5A:
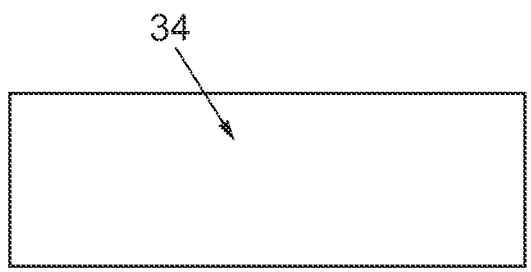
Figure 5B:
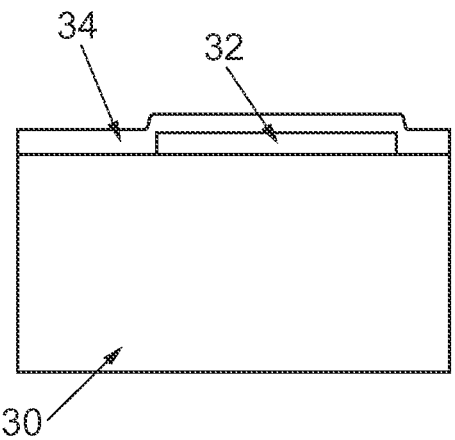
Figure 7A:
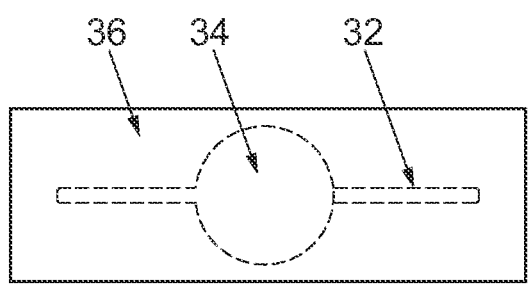
Figure 7B:
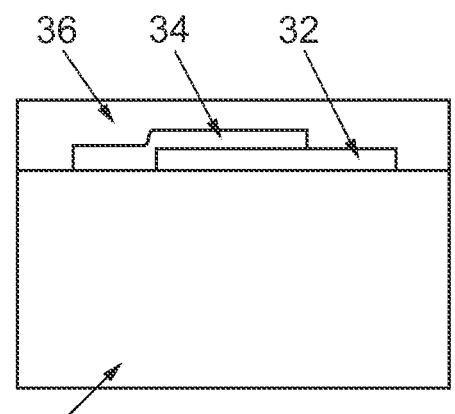
Figure 8A:
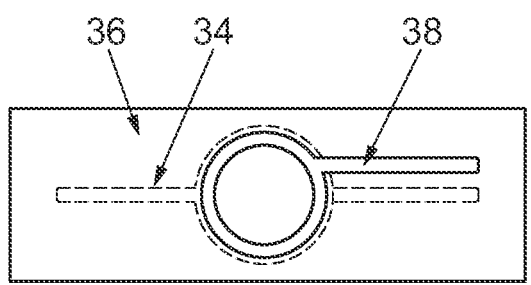
Figure 8B:
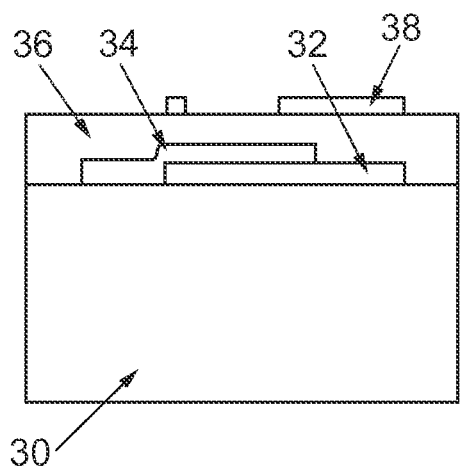
Figure 9A:
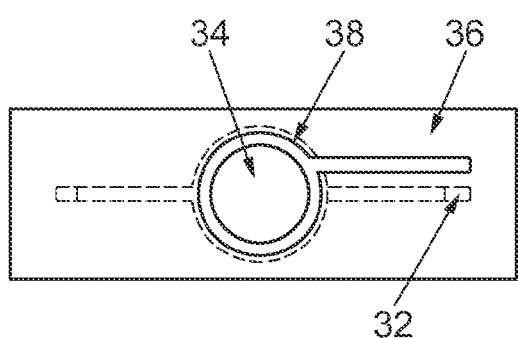
Figure 9B:
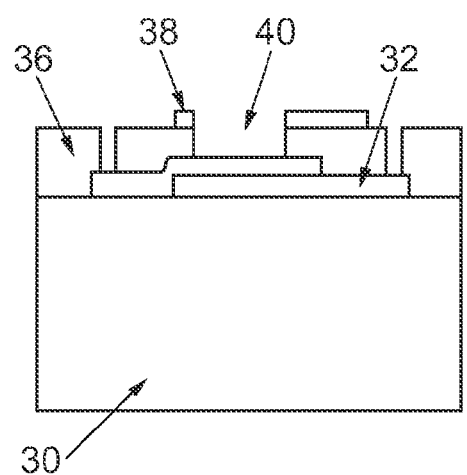

Arrays of FIG. 1 devices can readily be fabricated by microfabrication processes that are well-known to the integrated circuit and MEMs communities. FIGS. 2A-9B, for example, illustrate in detail the fabrication of a device in accordance with FIG. 1 but based upon polycrystalline Si rather than a single crystal semiconductor as in FIG. 1. In FIGS. 2A and 2B a flexible, non-conducting substrate 30 is provided. In FIGS. 3A and 3B a polysilicon emitter layer 32 is formed on the substrate 30. The emitter layer 32 is patterned in FIGS. 4A and 4B. In FIGS. 5A and 5B, a base layer 34 is deposited and patterned in FIGS. 6A and 6B. In FIGS. 7A and 7B dielectric 36 is deposited. In FIGS. 8A and 8B anode metal 38 is deposited in a pattern. In FIGS. 9A and 9B, the dielectric 36 is patterned to complete the device, which can permit circuit interconnection and provide a microcavity opening 40 that can support plasmas generation.

Another embodiment of the invention is a laterally doped PBJT, which is formed such that the entire device is contained within the device layer of a typical silicon-on-insulator (SOI) wafer, and the typical npn stack progresses horizontally, along the surface of the wafer. This device also lends itself readily to flexible applications. Formation of such a device is illustrated in FIGS. 9C-9L.

Figure 9C:
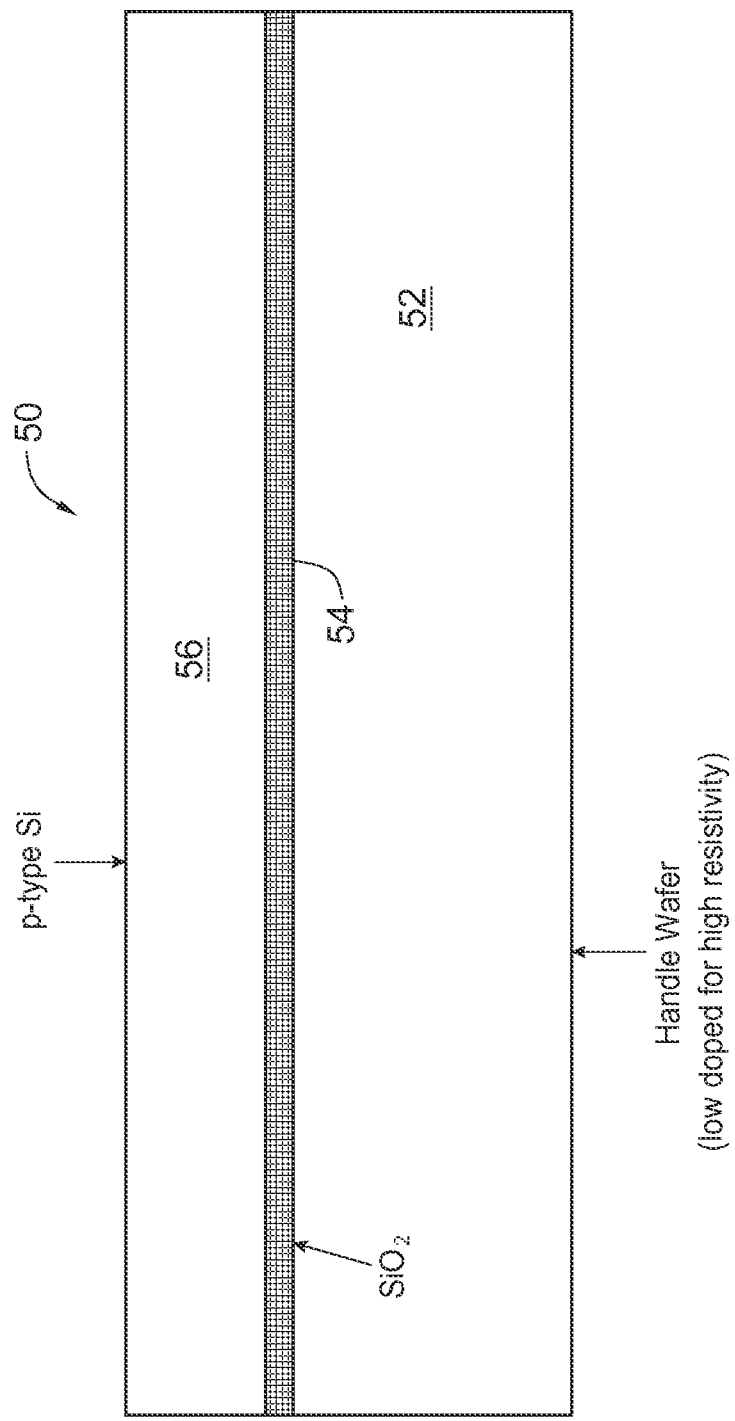
FIGS. 9C-9L illustrate a process for forming a preferred embodiment lateral flexible bipolar junction plasma transistor of the invention.
Figure 9D:
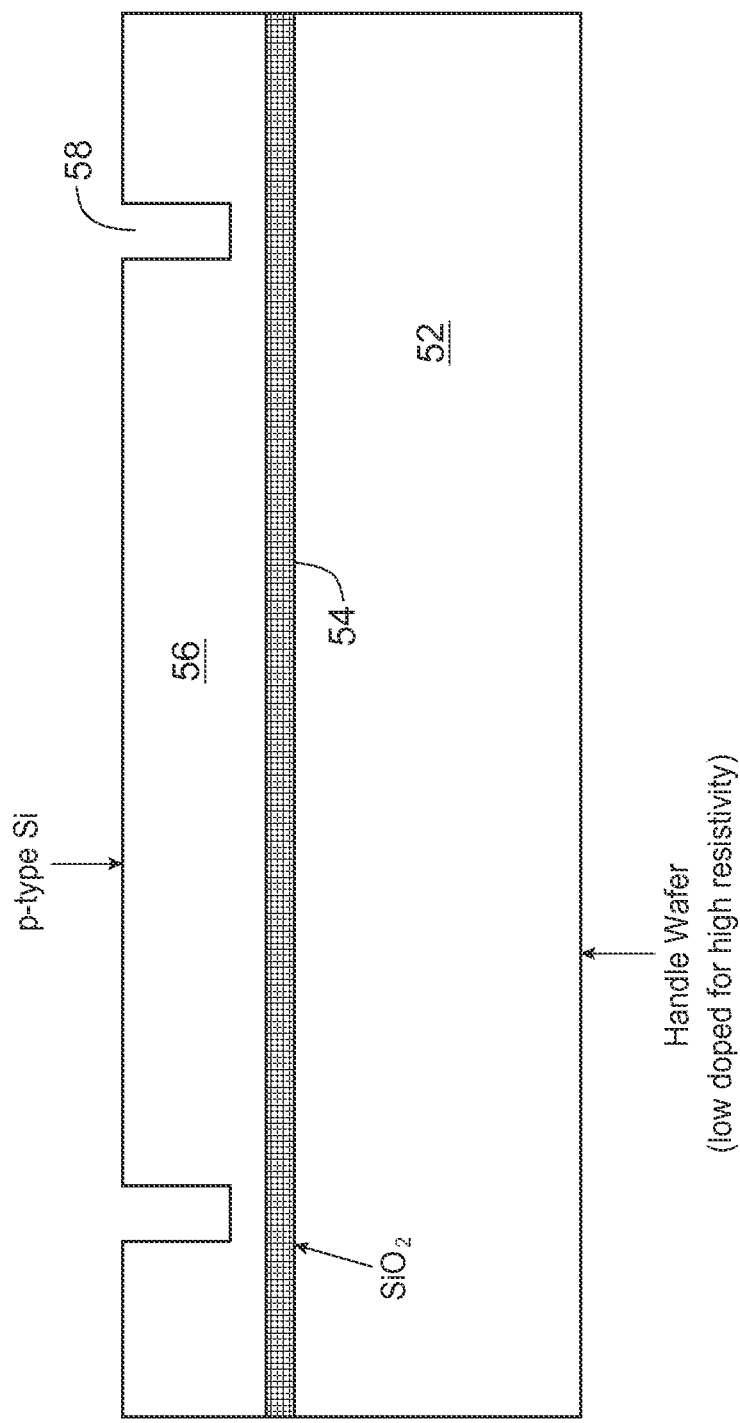
Figure 9E:
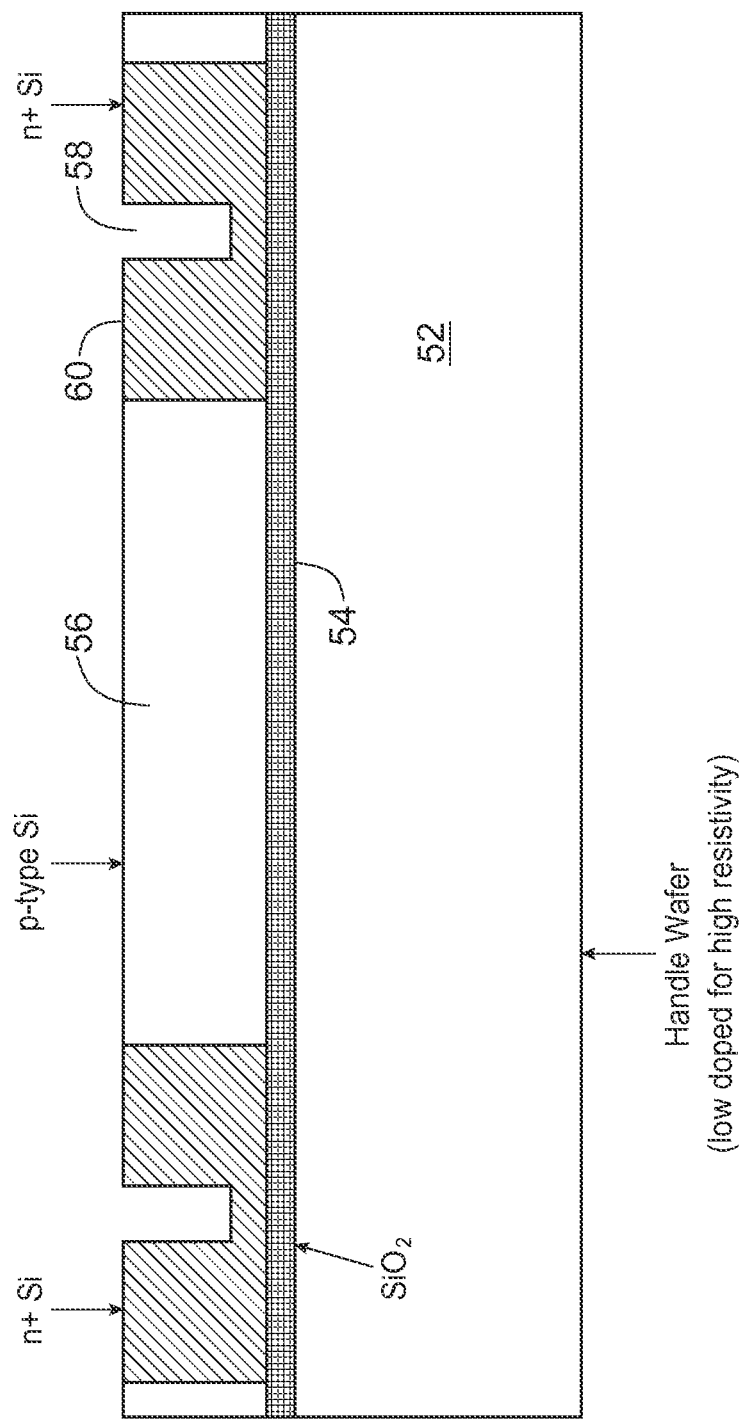
Figure 9F:
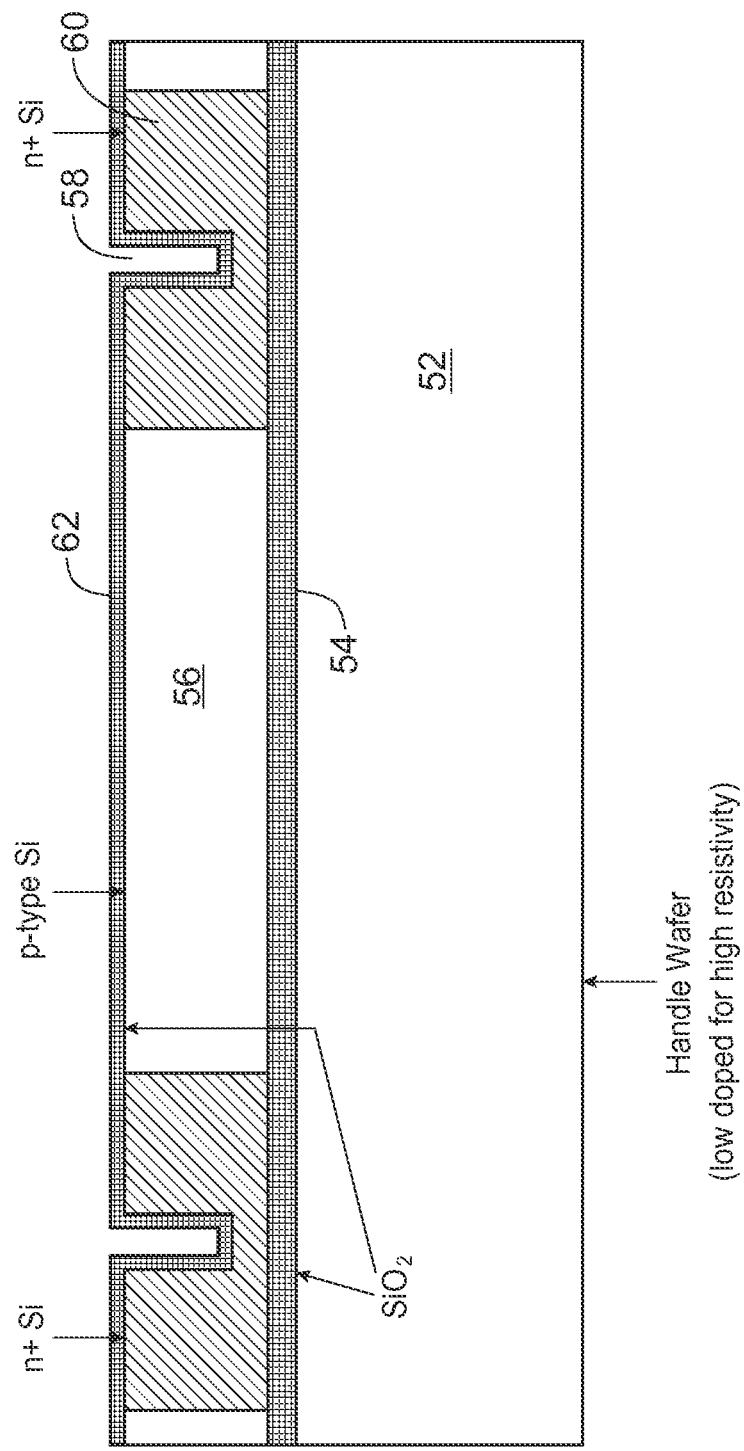
Figure 9G:
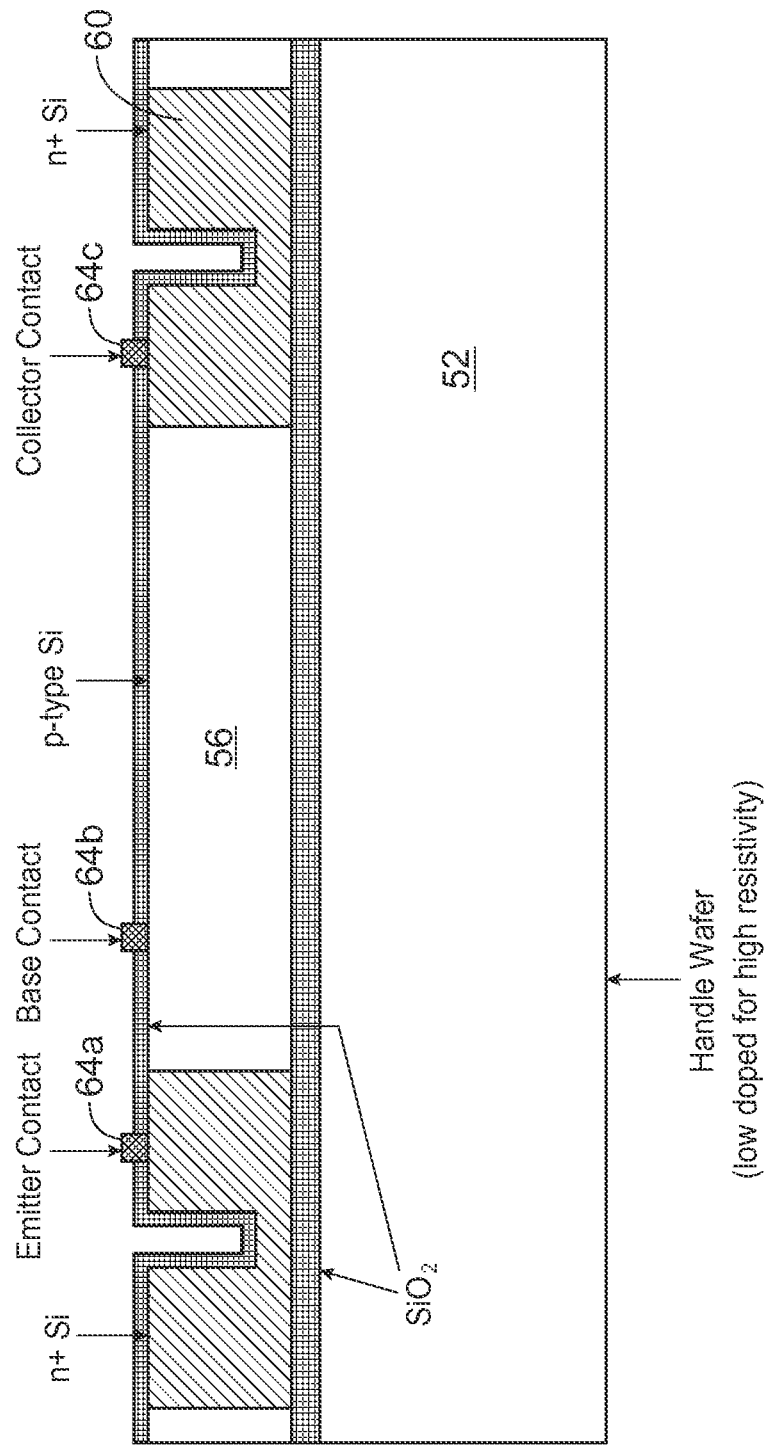

In FIG. 9C a silicon on insulator wafer 50 including a handle wafer 52 a silicon dioxide layer 54 and a p-type silicon layer 56 is provided. Trenches 58 are etched into the device layer 56 to accommodate subsequent predeposition and diffusion steps in FIG. 9D. In FIG. 9E, a thermal predeposition and drive are performed, doping the silicon with an n-type dopant 60 in areas around the trenches 58. An oxidation in FIG. 9F forms silicon dioxide layer 62 over the entire top of the structure. Metal contacts are deposited, allowing electrical contact to each of the three active regions (the emitter 64a, base 64b and collector 64c) in FIG. 9G. Subsequent steps can be conducted to form either on-wafer or off-wafer flexible devices.

Figure 9H:
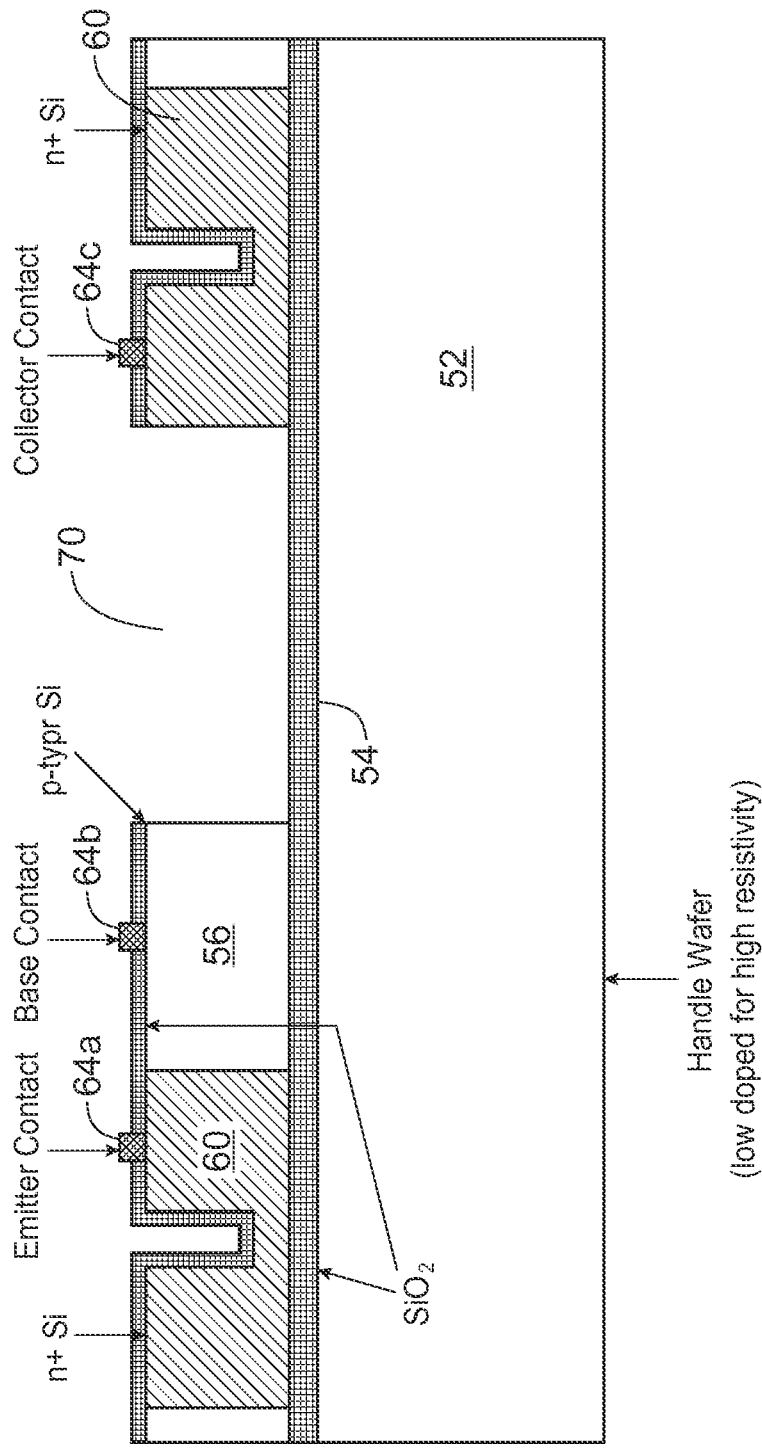
Figure 9I:
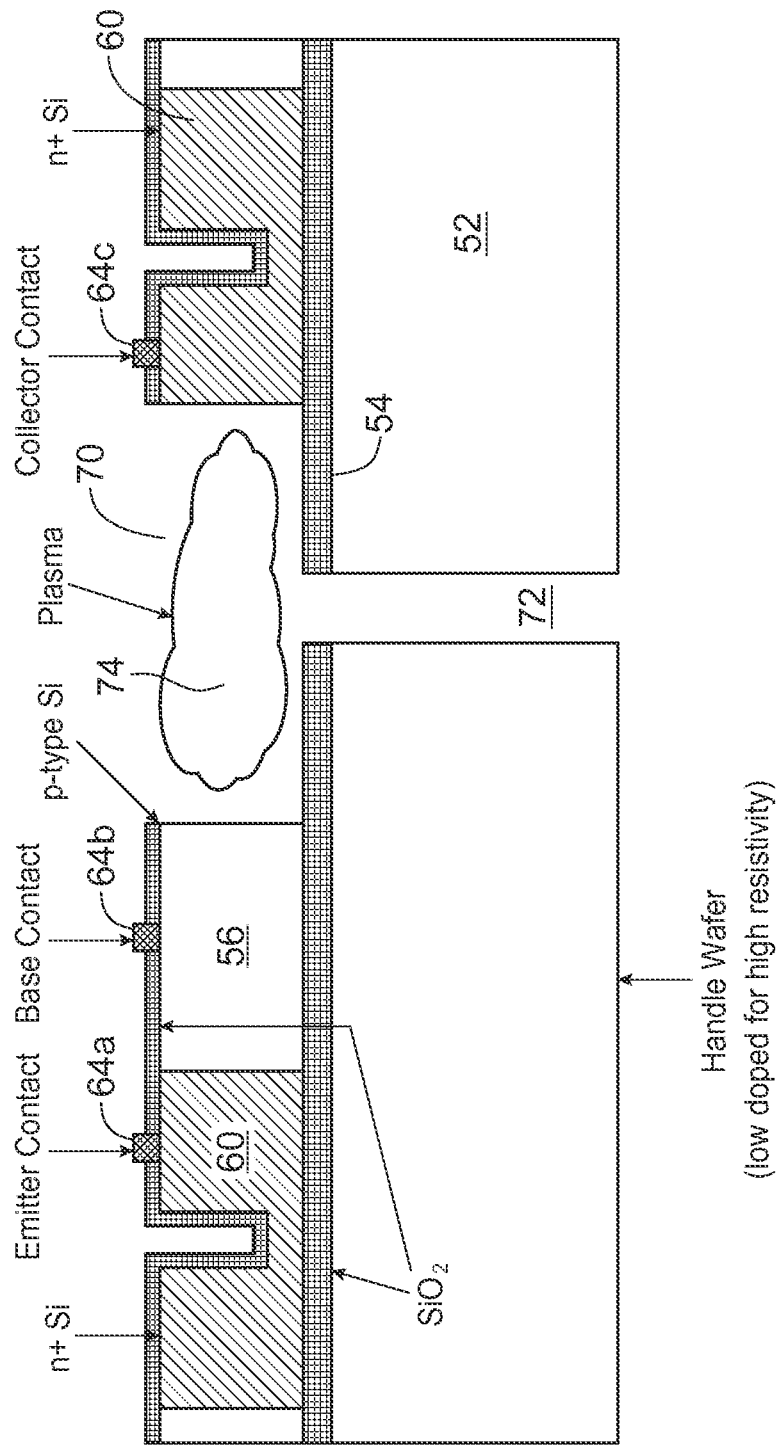

FIGS. 9H-9I illustrate the formation of and the structure and arrangement of on-wafer device. In FIG. 9H, a cavity 70 is etched into the silicon device layer between the p-type base 56 and the n-type collector 60. This cavity 70 is where the plasma will be contained during operation. FIG. 9H also illustrates a complete on-wafer device, and FIG. 9I illustrates a modified device in which a through-wafer via 72 can be included to allow gas exchange, either functioning as an inlet, outlet, or switching between the two as required by the application. FIG. 9I also illustrates plasma 74 acting as collector during device operation.

Figure 9J:
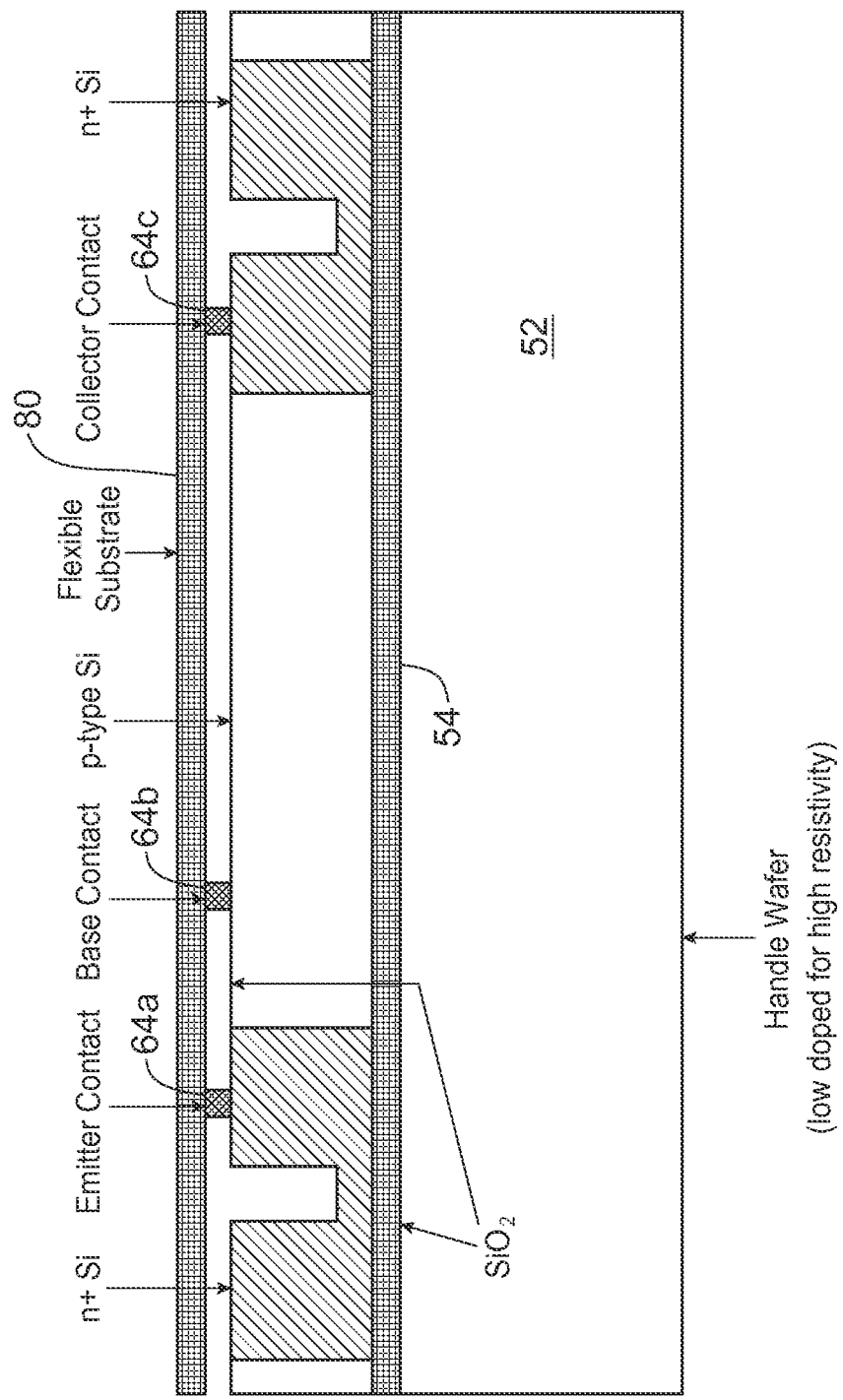
Figure 9K:
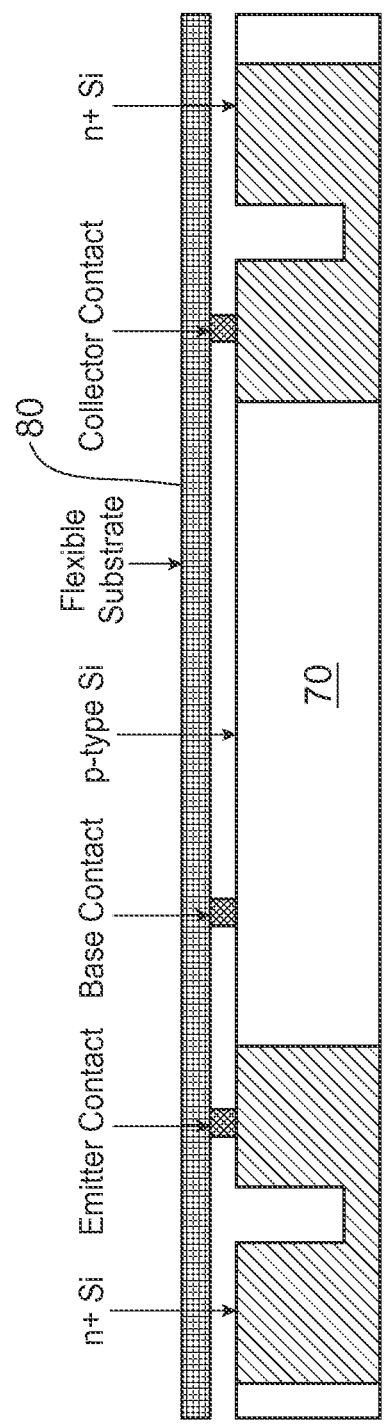
Figure 9L:
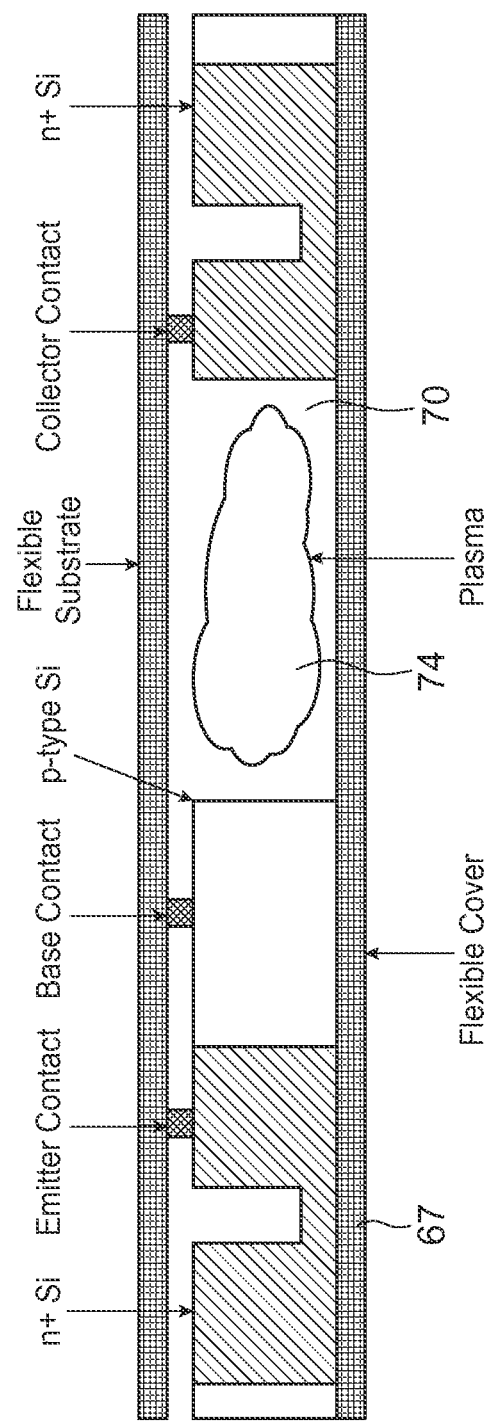

Flexible device fabrication changes after FIG. 5G. As shown in FIG. 9J, wafer is bonded to a flexible, metallized substrate 80, and in FIG. 9K, the handle wafer 52 is removed. FIG. 9L illustrates a complete device after a cavity 70 is etched between the p-type base and the n-type collector and a flexible cover 67 is bonded to the device layer sealing a plasma medium in the cavity 70, where plasma 74 can be generated. Of importance for the flexible devices, is the fact that thin membranes of silicon (such as the device layer) are, in fact, very flexible, granting flexibility to the entire finished device, so long as the substrate and cover are sufficiently flexible as well. The on-wafer devices allow the entire device to be fabricated on one side of a SOI wafer, with fewer processing steps and more robustness than previous designs. The addition of a through-wafer via allows for rapid gas exchange, should a particular application demand it (simple gas circulation for cooling purposes is one example). This design, due to its dimensions, lends itself readily to operation in pressures nearing and even above atmospheric pressure. The increased capability for cooling would make this device suitable for high-power switching, where power dissipation has traditionally been a problem.

The flexible devices in FIG. 9 allow the entire device to be fabricated on the device layer of a SOI wafer, which can be removed from the handle layer, and bonded to a flexible substrate, resulting in a flexible finished product. The ability to switch light-emitting plasmas on and off with relatively low voltages, combined with the flexibility of these devices, allows for the possibility of flexible displays.

An example process consistent with the on-wafer design begins with an SOI wafer having a 15 µm thick p-Si layer, a 2 µm thick buried oxide film, and a 375 µm thick "handle" Si layer. A flexible support (substrate) can also be used to replace the handle layer, and can form a cavity on the other side. Such a flexible layer can be a plastic (such as PET), Kapton, polyimide, or a similar flexible material. In other processes, inkjet printing or screen printing with Si nanoparticle inks is conducted on flexible substrates to form devices having similar electrode patterns.

Figure 10A:
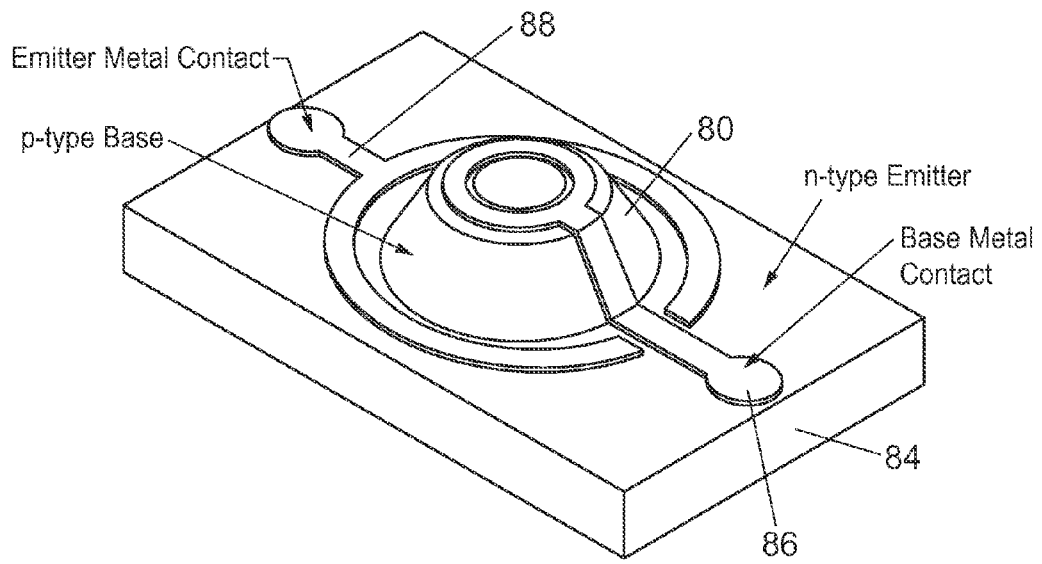
FIGS. 10A-10C illustrate a preferred embodiment mesa structure PBJT based on an epitaxial III-V wafer where the base and emitter regions are grown and then attached to a flexible substrate.
Figure 10B:
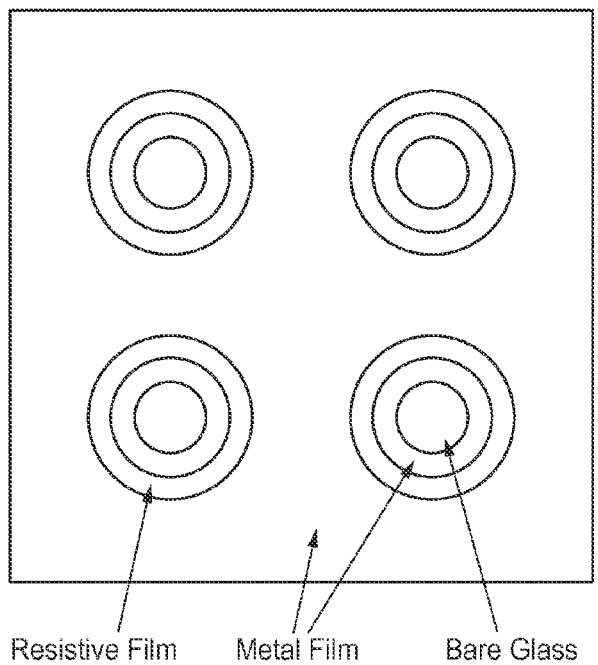
Figure 10C:
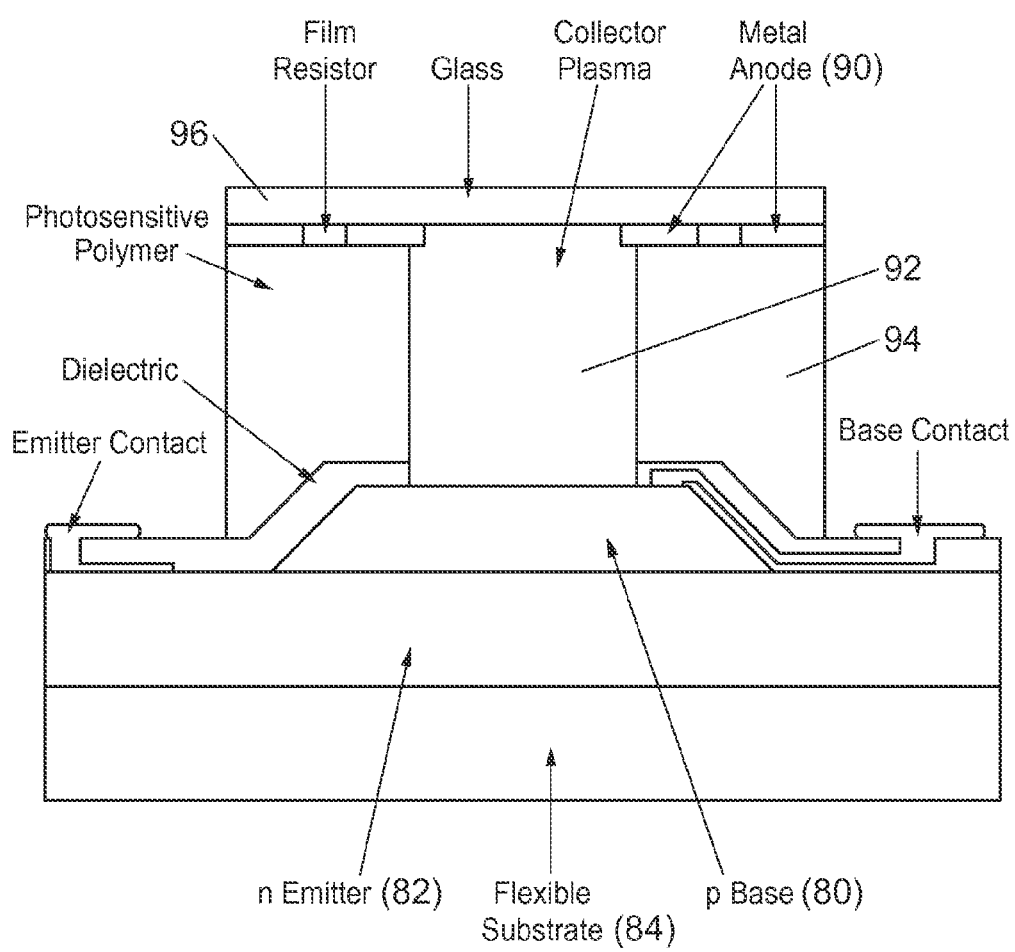

FIGS. 10A-10C show another preferred embodiment devices that is based upon an epitaxial mesa structure. With reference to FIG. 10C, which best illustrates all of the layers, a p type semiconductor layer 80 is grown on an n type substrate 82. The substrate 82 may be ultrathin and transferred to a flexible substrate 84 to allow for flexible devices. Base thickness as well as base and emitter doping levels can be the same as in U.S. patent application Ser. No. 12/817,551, which was filed on Jun. 17, 2010 and is incorporated by reference herein. To form isolated base regions, the base 80 can form a mesa can be defined by selective etching (For silicon devices a KOH bath with silicon nitride as mask can be used. This way a mesa can be formed with a sloped edge to avoid discontinuities of the base metal contact across the mesa edge.). The emitter 88 and base contact 86 can be formed by metallization. To complete the device, an anode 90 can be integrated on top of the mesa structure to generate the plasma, which is contained in a cavity 92 formed by a polymer, which together with a glass or other cover seal plasma medium in the cavity 92. FIG. 10B illustrates a batter of devices for a small array.

To form the anode, metal may be deposited onto a glass substrate and regions opened up in the metal (via lithographic techniques) to allow a window above the device for light transmission and optionally allow for the incorporation of annular ballast resistor. After the metal is removed a thin film resistor is deposited. The anode piece is then aligned and placed on top of the mesa structure separated by a photosensitive polymer layer. This technique is easily transferrable to make an array of mesa based PBJT devices by adapting appropriate photomasks during fabrication.

Another embodiment is the mesa structure PBJT based on an epitaxial III-V wafer where the base and emitter regions are grown and then attached to a flexible substrate. Metal organic chemical vapor deposition (MOCVD) forms multiple layers of GaAs and/or AlGaAs with composition and layouts that match device requirements. Each formed p-n junction made of GaAs and/or AlGaAs is separated by a sacrificial AlAs layer which is later selectively eliminated by inserting into hydrofluoric acid, thereby releasing large collection of p-n junctions, with size being defined before releasing. The released p-n junctions can be transferred and printed to a flexible substrate using deterministic assembly procedure reported by others See, Meitl, M. A. et al. "Transfer printing by kinetic control of adhesion to an elastomeric stamp" Nature Mater. 5, 33-38 (2006); Yoon, J. et al., "Ultrathin silicon solar microcells for semitransparent, mechanically flexible and microconcentrator module design" Nature Mater. 7, 907-915 (2008). A large array of devices can be easily formed in this way. The anode piece is later fabricated and aligned on top of the mesa structure in a similar fashion as in the aforementioned embodiment for silicon mesa PBJT.

Arrays of devices as illustrated are well-suited for the fabrication of high resolution, full color displays. The transistors are also amenable to gas phase sensors requiring the modulation of a plasma into which an impurity has been introduced. Fluorescence diagnostics of such plasmas will enable the detection of toxic or environmentally "unfriendly" gases or vapors in air samples, for example. Excimer laser ablation and patterning techniques can also be used to fabricate the devices on flexible, low cost substrates having surface areas of at least 1 $m^2$.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A flexible hybrid plasma semiconductor device, comprising doped solid state semiconductor regions in a thin flexible solid state substrate, a flexible non conducting material defining a microcavity adjacent the semiconductor regions, the flexible non conducting material being bonded to the thin flexible solid state substrate, and at least one electrode arranged with respect to said flexible substrate to generate a plasma in said microcavity, where the plasma will influence or perform a semiconducting function in cooperation with said solid state semiconductor regions.

2. An array of devices according to claim 1.

3. The device of claim 1, wherein at least one of the thin flexible substrate and the flexible non conducting material is transparent.

4. The device of claim 1, wherein the flexible non conducting material comprises plastic.

5. The device of claim 1, wherein the thin flexible substrate comprises silicon.

6. The device of claim 5, wherein the thin flexible substrate is ~15 µm thick.

7. The device of claim 1, wherein the device is planar.

8. The device of claim 1, wherein the doped solid state semiconductor regions and the thin flexible substrate comprises a p-type semiconductor base with an n-type emitter region diffused therein, the device further comprising contacts to the base and emitter regions and dielectric material to isolate the base and emitter contacts from each other.

9. The device of claim 8, wherein the dielectric material comprises one of $SiO_2$, $Y_2O_3$ and $Si_3N_4$.

10. The device of claim 1, further comprising a flexible window sealing a plasma medium in the microcavity.

11. The device of claim 1, wherein the doped solid state semiconductor regions in a thin flexible solid state substrate comprise Group III-V materials.

* * * * *

UNITED STATES PATENT AND TRADEMARK OFFICE
CERTIFICATE OF CORRECTION

PATENT NO. : 8,816,435 B2
APPLICATION NO. : 13/186401
DATED : August 26, 2014
INVENTOR(S) : J. Gary Eden et al.

It is certified that error appears in the above-identified patent and that said Letters Patent is hereby corrected as shown below:

In the Specification:

Col. 2, line 10   Please delete "ft2" and insert --$ft^2$-- therefor.

Col. 3, line 24   Between "the" and "invention", please delete "to".

Col. 3, line 50   After "invention", please delete "of the invention".

Col. 5, line 49   Please delete "devices" and insert --device-- therefor.

Signed and Sealed this
Twenty-fourth Day of February, 2015

Michelle K. Lee
*Deputy Director of the United States Patent and Trademark Office*